(12) United States Patent
Nakagawasai et al.

(10) Patent No.: US 11,417,504 B2
(45) Date of Patent: Aug. 16, 2022

(54) STAGE DEVICE AND PROCESSING APPARATUS

(71) Applicant: Tokyo Electron Limited, Tokyo (JP)

(72) Inventors: Manabu Nakagawasai, Tokyo (JP); Naoyuki Suzuki, Tokyo (JP); Shinji Orimoto, Yamanashi (JP); Hiroyuki Yokohara, Yamanashi (JP); Motoi Yamagata, Tokyo (JP); Koji Maeda, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 225 days.

(21) Appl. No.: 16/660,696

(22) Filed: Oct. 22, 2019

(65) Prior Publication Data
US 2020/0135434 A1    Apr. 30, 2020

(30) Foreign Application Priority Data

Oct. 25, 2018  (JP) .............................. JP2018-200491
Mar. 18, 2019  (JP) .............................. JP2019-050290

(51) Int. Cl.
*H01J 37/32*      (2006.01)
*C23C 14/34*     (2006.01)
(Continued)

(52) U.S. Cl.
CPC ........ *H01J 37/32724* (2013.01); *C23C 14/34* (2013.01); *C23C 14/505* (2013.01); *C23C 14/541* (2013.01); *H01F 41/32* (2013.01);
*H01J 37/32715* (2013.01); *H01J 37/3426* (2013.01); *H01L 21/67393* (2013.01);
(Continued)

(58) Field of Classification Search
None
See application file for complete search history.

(56) References Cited

U.S. PATENT DOCUMENTS

2004/0045813 A1\* 3/2004 Kanno ............. H01L 21/67109
                                                                    204/242
2008/0203925 A1\* 8/2008 Tandou ............. H01L 21/67109
                                                                    315/111.21
(Continued)

FOREIGN PATENT DOCUMENTS

JP        H11-131230 A    5/1999
JP        2006-073608 A   3/2006
(Continued)

*Primary Examiner* — Jason Berman
(74) *Attorney, Agent, or Firm* — Fenwick & West LLP

(57) ABSTRACT

A stage device includes a stage configured to hold a target substrate in a vacuum chamber, a cold heat transfer body fixedly disposed below a bottom surface of the stage with a gap between the stage and the cold heat transfer body and cooled to an extremely low temperature by a chiller disposed below the cold heat transfer body, and cooling fluid supplied to the gap to transfer cold heat of the cold heat transfer body to the stage. The stage device further includes a stage support configured to rotatably support the stage and formed in a cylindrical shape to surround an upper part of the cold heat transfer body wherein the stage support has a vacuum insulation structure, and a rotation part configured to support the stage support and rotated by a driving mechanism while being sealed with magnetic fluid.

19 Claims, 9 Drawing Sheets

(51) Int. Cl.

| | |
|---|---|
| *C23C 14/50* | (2006.01) |
| *C23C 14/54* | (2006.01) |
| *H01L 21/683* | (2006.01) |
| *H01F 41/32* | (2006.01) |
| *H01L 43/12* | (2006.01) |
| *H01J 37/34* | (2006.01) |
| *H01L 21/673* | (2006.01) |

(52) U.S. Cl.
CPC ........ *H01L 21/683* (2013.01); *H01L 21/6833* (2013.01); *H01L 43/12* (2013.01); *H01J 2237/002* (2013.01); *H01J 2237/20214* (2013.01); *H01J 2237/332* (2013.01)

(56) References Cited

U.S. PATENT DOCUMENTS

| | | | |
|---|---|---|---|
| 2014/0202995 A1* | 7/2014 | Miyake | ................. H01L 21/324 |
| | | | 219/121.37 |
| 2016/0071707 A1* | 3/2016 | Furukawa | ......... H01J 37/32715 |
| | | | 204/298.09 |
| 2017/0198395 A1* | 7/2017 | Nozawa | ............ H01L 21/67069 |
| 2020/0118802 A1* | 4/2020 | Lu | ........................ H01J 37/3441 |

FOREIGN PATENT DOCUMENTS

| | | |
|---|---|---|
| JP | 2011-080719 A | 4/2011 |
| JP | 2015-226010 A | 12/2015 |
| JP | 2017-087188 A | 5/2017 |
| KR | 10-2008-0135040 A | 12/2018 |
| WO | WO 2017/221631 A1 | 12/2017 |

* cited by examiner

STAGE DEVICE AND PROCESSING APPARATUS

CROSS-REFERENCE TO RELATED APPLICATIONS

This application claims priority to Japanese Patent Application Nos. 2018-200491 filed on Oct. 25, 2018, and 2019-050290 filed on Mar. 18, 2019, the entire contents of which are incorporated herein by reference.

TECHNICAL FIELD

The present disclosure relates to a stage device and a processing apparatus.

BACKGROUND

An apparatus for processing a substrate, e.g., a semiconductor substrate or the like, such as a film forming apparatus, performs an extremely low-temperature process. For example, there is known a technique for forming a magnetic film in environment of ultra-high vacuum and an extremely low temperature to obtain a magneto-resistance element having a high magneto-resistance ratio.

As an example of a technique for processing a substrate at an extremely low temperature, Japanese Patent Application Publication No. 2015-226010 discloses a technique for cooling a substrate to an extremely low temperature by a cooling apparatus and forming a magnetic film at an extremely low temperature on the cooled substrate by a film forming apparatus separately provided from the cooling apparatus.

Japanese Patent Application Publication No. 2006-73608 discloses a technique for forming a thin film while cooling a substrate on a cooling stage serving as a wafer support for supporting the substrate to an extremely low temperature. The cooling stage is fixed to a cooling head provided in a vacuum chamber, and the cooling head is cooled by a chiller.

The present disclosure provides a stage device capable of cooling a substrate mounted on a stage to an extremely low temperature with high cooling performance and rotating the substrate in a state where the substrate is cooled to the extremely low temperature, and a processing apparatus including the stage device.

SUMMARY

In accordance with an aspect of the present disclosure, there is provided a stage device including: a stage configured to hold a target substrate in a vacuum chamber; a cold heat transfer body fixedly disposed below a bottom surface of the stage with a gap between the stage and the cold heat transfer body and cooled to an extremely low temperature by a chiller disposed below the cold heat transfer body; cooling fluid supplied to the gap to transfer cold heat of the cold heat transfer body to the stage; a stage support configured to rotatably support the stage and formed in a cylindrical shape to surround an upper part of the cold heat transfer body wherein the stage support has a vacuum insulation structure; and a rotation part configured to support the stage support and rotated by a driving mechanism while being sealed with magnetic fluid.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments will be described in detail with reference to the accompanying drawings.

<Processing Apparatus>

Figure 1:
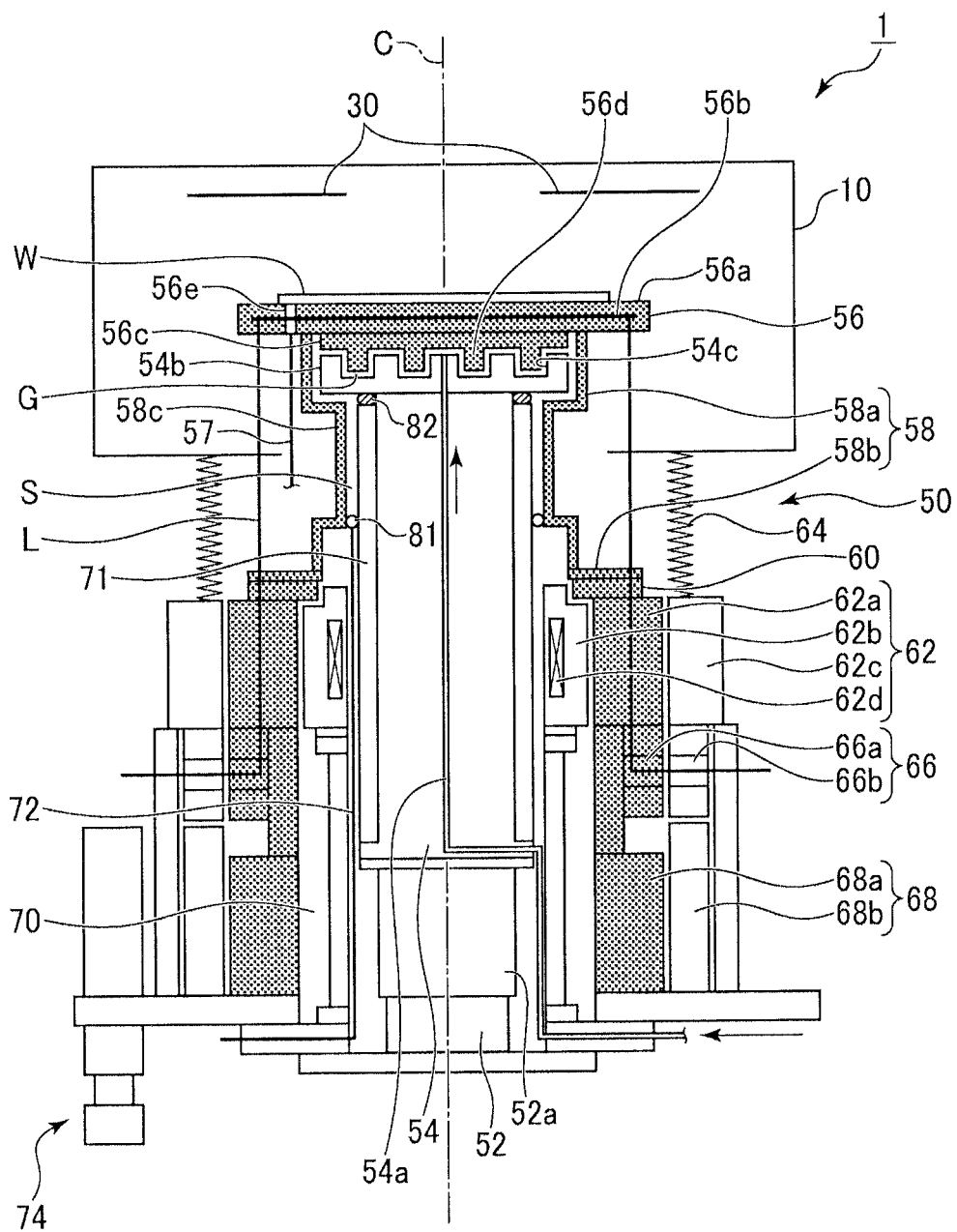
FIG. 1 is a schematic cross-sectional view showing an example of a processing apparatus including a stage device according to an embodiment.

First, an example of a processing apparatus including a stage device according to an embodiment will be described. FIG. 1 is a schematic cross-sectional view showing an example of the processing apparatus.

As shown in FIG. 1, a processing apparatus 1 includes a vacuum chamber 10, a target 30, and a stage device 50. The processing apparatus 1 is configured as a film forming apparatus capable of forming a magnetic film by sputtering on a semiconductor wafer (hereinafter, simply referred to as "wafer") W that is a target substrate in environment of ultra-high vacuum and an extremely low temperature in the vacuum chamber 10. The magnetic film is used for, e.g., a tunneling magneto-resistance (TMR) element.

The vacuum chamber 10 is a processing chamber for processing the wafer W that is the target substrate. The vacuum chamber 10 is connected to a gas exhaust unit (not shown) such as a vacuum pump capable of depressurizing the inside of the vacuum chamber 10 to ultra-high vacuum (e.g., $10^{-5}$ Pa or less). A gas supply line (not shown) is connected from the outside to the vacuum chamber 10. A sputtering gas for sputtering film formation (e.g., nitrogen gas or rare gas such as argon (Ar) gas, krypton (Kr) gas, neon (Ne) gas or the like) is supplied through the gas supply line. A loading/unloading port (not shown) for the wafer W is formed at a sidewall of the vacuum chamber 10, and can be opened and closed by a gate valve (not shown).

The target 30 is disposed at an upper portion of the vacuum chamber 10 to face the wafer W held on the stage device 50. An AC voltage is applied from a plasma generation power supply (not shown) to the target 30. When the AC voltage is applied from the plasma generation power supply to the target 30 in a state where the sputtering gas is introduced into the vacuum chamber 10, plasma of the sputtering gas is generated in the vacuum chamber 10 and the target 30 is sputtered by ions in the plasma. Atoms or molecules of the sputtered target material are deposited on the surface of the wafer W held on the stage device 50. Although the number of targets 30 is not particularly limited, it is preferable to provide a plurality of targets 30 so that films of different materials can be formed by one processing apparatus 1. For example, in the case of depositing a magnetic film (film containing a ferromagnetic material such as Ni, Fe, Co, or the like), the target 30 may be made of, e.g., CoFe, FeNi, NiFeCo, or the like. Alternatively, the target 30 may be made of other materials in addition to those materials.

As will be described later, the stage device 50 cools the wafer W held on the stage 56 to an extremely low temperature while rotating the wafer W.

The processing apparatus 1 further includes an elevation mechanism 74 for vertically moving the entire stage device 50 with respect to the vacuum chamber 10. Therefore, the distance between the target 30 and the wafer W can be controlled. Specifically, the stage device 50 is vertically moved by the elevation mechanism 74, so that the stage 56 can be moved between a transfer position for mounting the wafer W on the stage 56 and a processing position for forming a film on the wafer W mounted on the stage 56.

<Stage Device>

Next, the stage device 50 according to the embodiment will be described in detail.

As shown in FIG. 1, the stage device 50 includes a chiller 52, a cold heat transfer body 54, and a stage 56, a stage support 58, a seal rotation mechanism 62, and a driving mechanism 68.

The chiller 52 supports the cold heat transfer body 54 and cools an upper surface of the cold heat transfer body 54 to an extremely low temperature (e.g., −30° C. or lower). The chiller 52 has a cold head 52a at an upper portion thereof, and cold heat is transferred from the cold head 52a to the cold heat transfer body 54. The chiller 52 preferably uses Gifford-McMahon (GM) cycle in view of cooling performance. In the case of forming a magnetic film used for a TMR element, it is preferable to cool the cold heat transfer body 54 to a temperature in a range from −23° C. to −223° C. (250K to 50K) by the chiller 52. In addition, a heating mode can be performed by reversely driving the cooling cycle of the chiller 52. By setting the chiller 52 to the heating mode during maintenance or the like, it is possible to heat the stage 56 to a room temperature via the cold heat transfer body 54.

The cold heat transfer body 54 is fixed onto the chiller 52 and has a substantially cylindrical shape. The cold heat transfer body 54 is made of a material having high thermal conductivity, such as pure copper (Cu) or the like. An upper portion of the cold heat transfer body 54 is disposed in the vacuum chamber 10.

The cold heat transfer body 54 is disposed below the stage 56 such that the center thereof coincides with the central axis C of the stage 56. A first cooling gas supply line (first cooling gas channel) 54a through which a first cooling gas flows is formed in the cold heat transfer body 54 along the central axis C. The first cooling gas is supplied from a gas supply source (not shown) to the first cooling gas supply line 54a. It is preferable to use helium (He) gas having high thermal conductivity as the first cooling gas.

The stage 56 is separated from the upper surface of the cold heat transfer body 54 by a gap G (e.g., 2 mm or less). The stage 56 is made of a material having high thermal conductivity such as pure copper (Cu) or the like. The gap G communicates with the first cooling gas supply line 54a formed in the cold heat transfer body 54. Therefore, the first cooling gas cooled to an extremely low temperature by the cold heat transfer body 54 is supplied to the gap G through the first cooling gas supply line 54a. Accordingly, the cold heat of the chiller 52 is transferred to the stage 56 by the first cooling gas supplied to the cold heat transfer body 54 and the gap G, thereby cooling the stage 56 to an extremely low temperature (e.g., −30° C. or lower).

By forming the first cooling gas supply line 54a from the lower end toward the upper end of the cold heat transfer body 54, the first cooling gas supplied from the outside of the device can be sufficiently cooled. Accordingly, the heat transfer in the gap G is not hindered by the temperature of the first cooling gas, and thus the stage 56 can be efficiently cooled to an extremely low temperature.

A mesh-shaped member may be disposed in the first cooling gas supply line 54a to increase the cooling efficiency of the first cooling gas flowing through the first cooling gas supply line 54a by the cold heat transfer body 54. With this configuration, a contact area between the first cooling gas flowing through the first cooling gas supply line 54a and the cold heat transfer body 54 increases, which makes it possible to cool the first cooling gas efficiently.

The stage may be cooled using a liquid coolant such as antifreeze liquid other than the cooling gas. Alternatively, the gap G may be filled with thermal grease having good thermal conductivity. In addition, a cooling circulation system in which a compressor, an expansion valve, a pressure control valve, and the like are connected to the first cooling gas supply line 54a may perform cooling using gas having a high pressure and a low boiling point. When the gap G is filled with the thermal grease, the first cooling gas supply line 54a is not required and, thus, the structure of the cold heat transfer body 54 can be simplified.

A pressure control mechanism for controlling a pressure of the first cooling gas flowing through the first cooling gas supply line 54a may be provided. Since the heat transfer rate of the first cooling gas can be controlled by controlling the pressure, it is possible to cope with various sputtering processes having different temperature zones.

The stage 56 includes an electrostatic chuck 56a. The electrostatic chuck 56a has a dielectric film, and a chuck electrode 56b is embedded therein. A predetermined DC voltage is applied to the chuck electrode 56b through a wiring L. Accordingly, the wafer W can be electrostatically attracted and held by an electrostatic force.

The stage 56 has a first heat transfer part 56c below the electrostatic chuck 56a. A protrusion 56d protruding toward the cold heat transfer body 54 is formed on a bottom surface of the first heat transfer part 56c. In the illustrated example, the protrusion 56d has two annular parts surrounding the central axis C of the stage 56. The height of the protrusion 56d may be set to be, e.g., in a range from 40 mm to 50 mm. The width of the protrusion 56d may be set to be, e.g., in a range from 6 mm to 7 mm. The shape and the number of the protrusions 56d are not particularly limited. However, it is preferable to set the shape and the number of the protrusions 56d such that the surface area where heat exchange can be sufficiently performed can be obtained in view of improvement of the heat transfer efficiency between the protrusion 56d and the cold heat transfer body 54.

The cold heat transfer body 54 has a second heat transfer part 54b on an upper surface of a main body thereof, i.e., on the surface facing the first heat transfer part 56c. A recess 54c into which the protrusion 56d is fitted with the gap G therebetween is formed at the second heat transfer part 54b. In the illustrated example, the recess 54c has two annular parts surrounding the central axis C of the stage 56. The height of the recess 54c may be equal to that of the protrusion 56d, and may be, e.g., in a range from 40 mm to 50 mm. The width of the recess 54c may be slightly greater than that of the protrusion 56d, and is preferably, e.g., in a range from 7 mm to 9 mm. The shape and the number of the recesses 54c are determined to correspond to those of the protrusion 56d.

The protrusion 56d of the first heat transfer part 56c and the recess 54c of the second heat transfer part 54b are fitted with the gap G therebetween, thereby forming a comb-teeth shaped portion. Since the gap G is bent to have a concave-convex pattern due to the comb-teeth shaped portion, the heat transfer efficiency of the first cooling gas between the first heat transfer part 56c of the stage 56 and the second heat transfer part 54b of the cold heat transfer body 55 can be increased.

Figure 2:
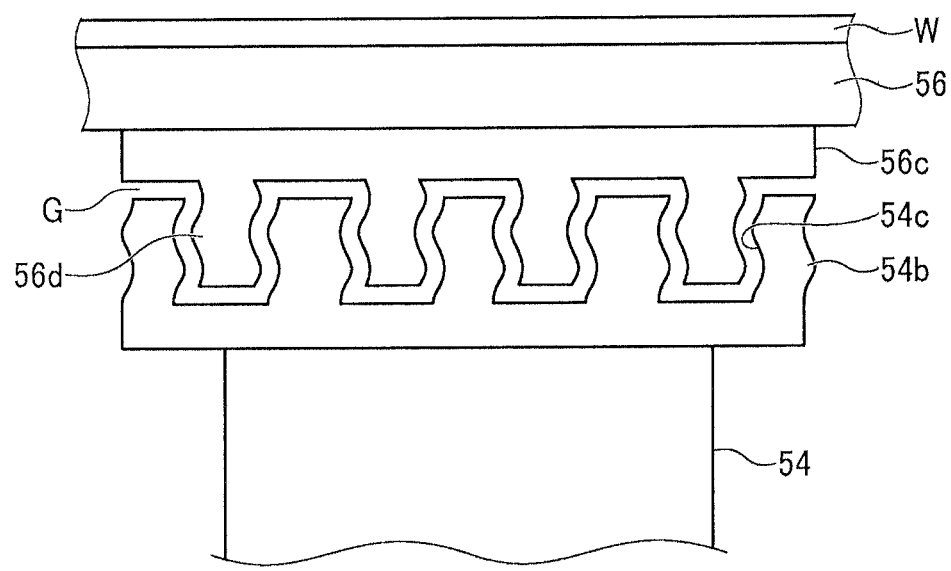
FIG. 2 schematically shows another shape of a comb-teeth shaped portion in the stage device according to the embodiment.

As shown in FIG. 2, the protrusion 56d and the recess 54c may have corrugated shapes corresponding to each other. Each of the surfaces of the protrusion 56d and the recess 54c may have an uneven pattern by blasting or the like. Accordingly, the surface area for the heat transfer can be increased, and the heat transfer efficiency can be further improved.

It is also possible to form the recess at the first heat transfer part 56c and form the protrusion at the second heat transfer part 54b.

In the stage 56, the electrostatic chuck 56a and the first heat transfer part 56c may be formed as one unit, or may be formed separately and adhered to each other. The main body of the cold heat transfer body 54 and the second heat transfer part 54b may be formed as one unit, or may be molded separately and adhered to each other.

A through-hole 56e is formed through the stage 56 in a vertical direction. A second cooling gas supply line (second cooling gas channel) 57 is connected to the through-hole 56e. A second cooling gas for heat transfer is supplied from the second cooling gas supply line 57 to the backside of the wafer W through the through-hole 56e. It is preferable to use He gas having high thermal conductivity as the second cooling gas, as in the case of the first cooling gas. By supplying the second cooling gas to the backside of the wafer W, i.e., to the gap between the wafer W and the electrostatic chuck 56a, the cold heat of the stage 56 can be efficiently transferred to the wafer W by the second cooling gas. One through-hole 56e may be provided. However, it is preferable to form a plurality of through-holes 56e in order to efficiently transfer the cold heat of the cold heat transfer body 54 to the wafer W.

By separating the gas channel of the second cooling gas to be supplied to the backside of the wafer W from the gas channel of the first cooling gas to be supplied to the gap G, it is possible to supply the cooling gas to the backside of the wafer W at a desired pressure and at a desired flow rate, regardless of the supply of the first cooling gas. It is also possible to continuously supply cooling gas having a high pressure and an extremely low temperature to the gap G, regardless of the pressure, the flow rate, and the supply timing of the gas to be supplied to the backside of the wafer W.

Further, a through-hole connected from the gap G may be formed in the stage 56 so that a part of the first cooling gas as the cooling gas can be supplied to the backside of the wafer W.

A contacting/separating mechanism may be provided to bring the first heat transfer part 56c and the second heat transfer part 54b into contact with each other or separate them from each other. By providing the contacting/separating mechanism, the first heat transfer part 56c and the second heat transfer part 54b can be brought into contact with each other when the stage 56 is not rotating. At this time, the heat transfer increases so that it is possible to cope with rapid cooling or rapid heating. For example, in the case of performing cooling using only a cooling gas, temperature drift may occur when the wafer W is mounted on the stage 56. However, the temperature drift can be suppressed by performing rapid cooling in a state where the first heat transfer part 56c and the second heat transfer part 54b are in contact with each other. Further, the temperature of the stage 56 can be quickly returned to a room temperature by reversely driving the cooling cycle of the chiller 52 in a state where the first heat transfer part 56c and the second heat transfer part 54b are in contact with each other.

Figure 3A:
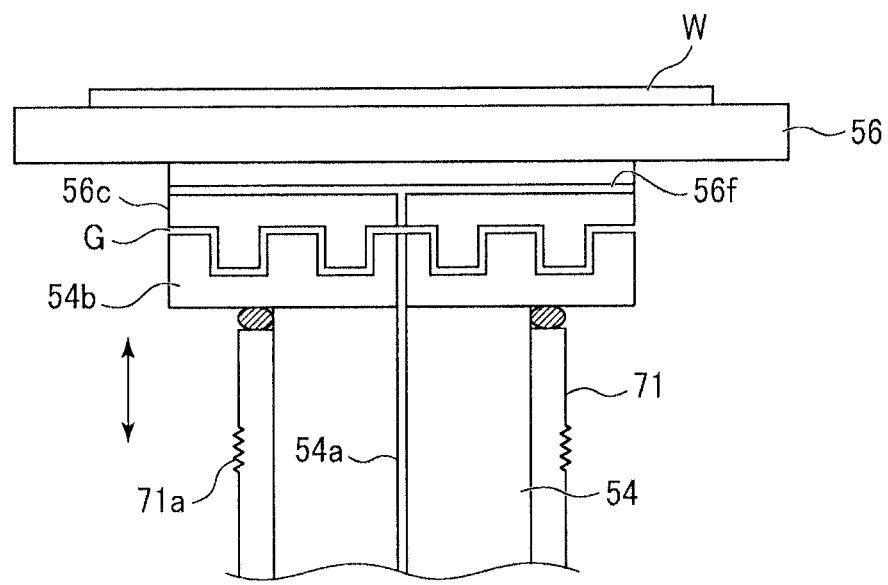
FIG. 3A shows an example of a contacting/separating mechanism for bringing a first heat transfer part and a second heat transfer part into contact with each other or separating them from each other by vertically moving a cold heat transfer body and shows a state where the first heat transfer part and the second heat transfer part are separated from each other.
Figure 3B:
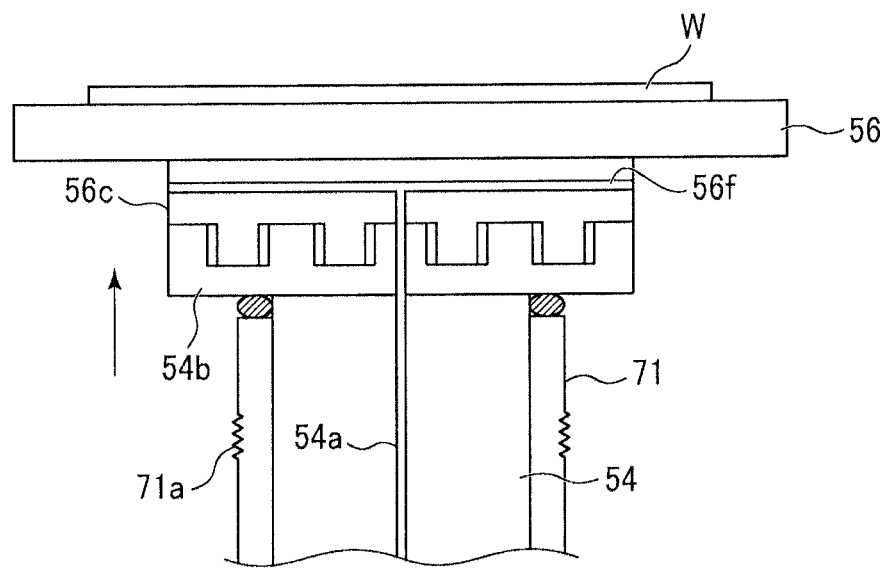
FIG. 3B shows a state of the contacting/separating mechanism shown in FIG. 3A where the first heat transfer part and the second heat transfer part are in contact with each other.

As an example of the contacting/separating mechanism, a mechanism for vertically moving the cold heat transfer body 54 (including the second heat transfer part 54b) as shown in FIGS. 3A and 3B may be used. FIG. 3A shows a state in which the first heat transfer part 56c and the second heat transfer part 54b are separated from each other with a gap G therebetween. FIG. 3B shows a state in which the first heat transfer part 56c and the second heat transfer part 56c are in contact with each other by lifting the cold heat transfer body 54.

Here, as shown in FIGS. 3A and 3B, a second heat insulating body 71 to be described later preferably has a bellows 71a to respond to the vertical movement of the cold heat transfer body 54. Further, as shown in FIGS. 3A and 3B, it is preferable to form a gas channel 56f in the first heat transfer part 56c. Accordingly, the stage 56 can be cooled by the first cooling gas even when the first heat transfer part 56c and the second heat transfer part 54b are in contact with each other. Although it is preferable to vertically move the cold heat transfer body 54 together with the chiller 52 as one unit, if it is possible to sufficiently increase the thermal capacity of the cold heat transfer body 54, the cold heat transfer body 54 may be vertically moved only in a state where the chiller 52 is fixed. Further, the contacting/separating mechanism may vertically move the stage 56 (including the first heat transfer part 56c) instead of the cold heat transfer body 54.

As another example of the contacting/separating mechanism, there may be used a metal member for bringing the first heat transfer part 56c and the second heat transfer part 54b into contact with each other or separating them from each other while maintaining the gap G between the first heat transfer part 56c and the second heat transfer part 54b. Specifically, the metal member may be disposed between the first heat transfer part 56c and the second heat transfer part 54b and deformed to bring them into contact with each other or separate them from each other by voltage application.

Figure 4A:
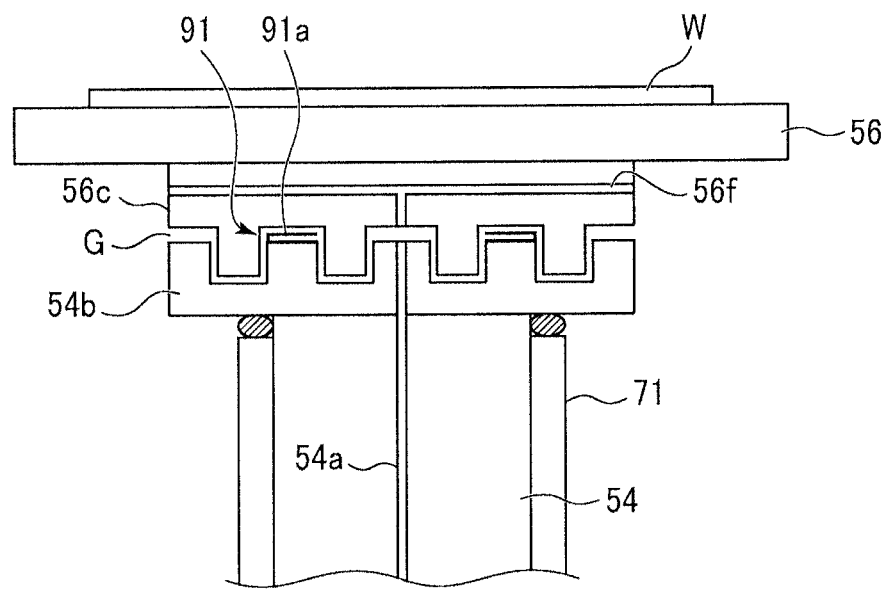
FIG. 4A shows another example of a contacting/separating mechanism for bringing a first heat transfer part and a second heat transfer part into contact with each other or separating them from each other by disposing a ring-shaped bimetal member between the first heat transfer part and the second heat transfer part, and shows a state where the first heat transfer part and the second heat transfer part are separated from each other.
Figure 4B:
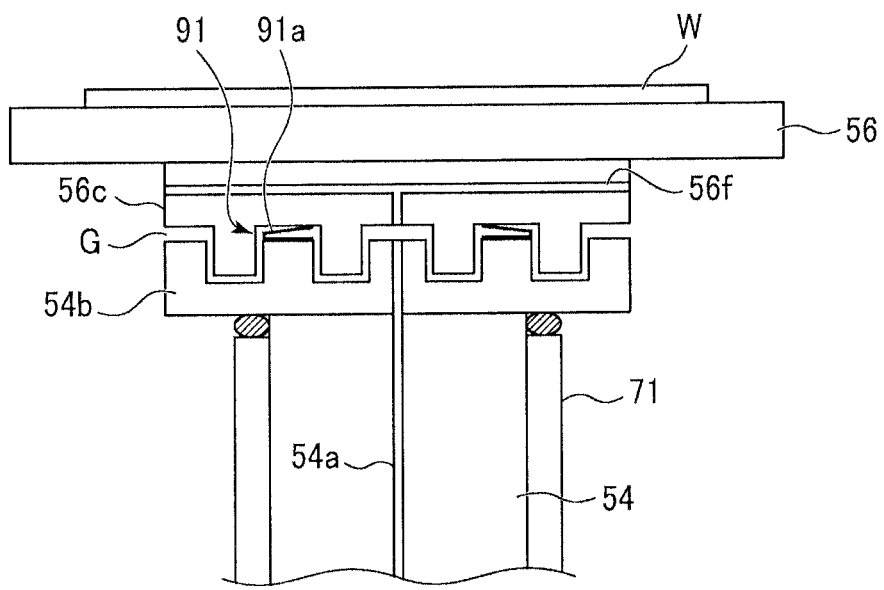
FIG. 4B shows a state of the contacting/separating mechanism shown in FIG. 4A where the first heat transfer part and the second heat transfer part are in contact with each other.

For example, as shown in FIGS. 4A and 4B, a ring-shaped bimetal member 91 is disposed between the first heat transfer part 56c and the second heat transfer part 54b. In this example, the ring-shaped bimetal member 91 is disposed at the second heat transfer part 54b, and a ring-shaped movable part (bimetal) 91a is disposed on the first heat transfer part 56c side. A voltage can be applied to the bimetal member 91 through a wiring drawn from an external power supply through, e.g., the first cooling gas supply line 54a. FIG. 4A shows a state in which no voltage is applied and the movable part (bimetal) 91a is separated from the first heat transfer part 56c. FIG. 4B shows a state in which the movable part (bimetal) 91a is deformed by the voltage application and brought into contact with the first heat transfer part 56c.

In this example as well, it is preferable that the gas channel 56f is formed in the first heat transfer part 56c, so that the stage 56 can be cooled by the first cooling gas even when the first heat transfer part 56c and the second heat transfer part 54b are brought into contact with each other. Further, the bimetal member 91 may be disposed at the first heat transfer part 56c to bring the movable part (bimetal) 91a into contact with or separate the movable part 91a from the second heat transfer part 54b. The contacting/separating mechanism using the metal member may a fin-type member that is deformed in a vertical direction by the voltage application.

The stage support 58 is disposed at an outer side of the cold heat transfer body 54, and the stage 56 is rotatably supported by the stage support 58 (see FIG. 1). In the illustrated example, the stage support 58 has a main body 58a having a substantially cylindrical shape, and a flange portion 58b extending outward at a bottom surface of the main body 58a. The main body 58a is disposed to surround the gap G and the upper outer peripheral surface of the cold heat transfer body 54. Accordingly, the stage support 58 can block the gap G that is the connection portion between the cold heat transfer body 54 and the stage 56. The stage support 58 preferably has a heat insulating structure. The main body 58a has a diameter-reduced section 58c at an axially central portion thereof. The main body 58a and the flange portion 58b are made of a metal, e.g., stainless steel or the like.

A heat insulating member 60 is connected to the bottom surface of the flange portion 58b. The heat insulating member 60 has an annular shape that is coaxial with the flange portion 58b, and is fixed to the flange portion 58b. The heat insulating member 60 is made of ceramic such as alumina or the like.

The seal rotation mechanism 62 is disposed below the heat insulating member 60. The seal rotation mechanism 62 includes a rotating part 62a, an inner fixing part 62b, an outer fixing part 62c, and a heating member 62d.

The rotating part 62a has a substantially cylindrical shape and extends downward coaxially with the heat insulating member 60. Further, the rotating part 62a is rotated by the driving mechanism 68 while being hermetically sealed with magnetic fluid with respect to the inner fixing part 62b and the outer fixing part 62c. Since the rotating part 62a is connected to the stage support 58 via the heat insulating member 60, the transfer of the cold heat from the stage support 58 to the rotating part 62a is blocked by the heat insulating member 60. Therefore, it is possible to suppress the deterioration of the sealing performance or the occurrence of condensation due to a decrease in the temperature of the magnetic fluid of the seal rotation mechanism 62.

The inner fixing part 62b has a substantially cylindrical shape having an inner diameter greater than an outer diameter of the cold heat transfer body 54 and an outer diameter smaller than an inner diameter of the rotating part 62a. The inner fixing part 62b is disposed between the cold heat transfer body 54 and the rotating part 62a through magnetic fluid.

The outer fixing part 62c has a substantially cylindrical shape having an inner diameter greater than an outer diameter of the rotating part 62a. The outer fixing part 62c is disposed at an outer side of the rotating part 62a through magnetic fluid.

The heating member 62d is embedded in the inner fixing part 62b to heat the entire seal rotation mechanism 62. Accordingly, it is possible to suppress the deterioration of the sealing performance or the occurrence of condensation due to the decrease in the temperature of the magnetic fluid.

With this configuration, the seal rotation mechanism 62 can rotate the stage support 58 in a state where the region communicating with the vacuum chamber 10 is hermetically sealed with magnetic fluid and maintained in a vacuum state.

A bellows 64 is disposed between the upper surface of the outer fixing part 62c and the bottom surface of the vacuum chamber 10. The bellows 64 has a metal bellows structure that can be expanded and contracted in a vertical direction. The bellows 64 surrounds the cold heat transfer body 54, the stage support 58, and the heat insulating member 60, and separates the space in the vacuum chamber 10 and the vacuum space communicating therewith from the space of an atmospheric atmosphere.

A slip ring 66 is disposed below the seal rotation mechanism 62. The slip ring 66 includes a rotating body 66a having a metal ring, and a fixed body 66b having a brush. The rotating body 66a is fixed to the bottom surface of the rotating part 62a of the seal rotation mechanism 62. Further, the rotating body 66a has a substantially cylindrical shape and extends downward coaxially with the rotating part 62a. The fixed body 66b has a substantially cylindrical shape having an inner diameter slightly greater than an outer diameter of the rotating body 66a.

The slip ring 66 is electrically connected to a DC power supply (not shown), and transmits a voltage supplied from the DC power supply to the wiring L via the brush of the fixed body 66b and the metal ring of the rotating body 66a. Accordingly, the voltage can be applied from the DC power supply to the chuck electrode without causing, e.g., torsion of the wiring L. The rotating body 66a of the slip ring 66 is rotated via the driving mechanism 68.

The driving mechanism 68 is a direct driving motor having a rotor 68a and a stator 68b. The rotor 68a has a substantially cylindrical shape and extends coaxially with the rotating body 66a of the slip ring 66. The rotor 68a is fixed to the rotating body 66a. The stator 68b is formed in a substantially cylindrical shape having an inner diameter greater than an outer diameter of the rotor 68a. When the driving mechanism 68 is driven, the rotor 68a rotates. The rotation of the rotor 68a is transferred to the stage 56 via the rotating body 66a, the rotating part 62a, and the stage support 58. Accordingly, the stage 56 and the wafer W thereon rotate with respect to the cold heat transfer body 54. In FIG. 1, the rotating members are illustrated with dots for the sake of convenience.

Although the direct driving motor has been described as an example of the driving mechanism 68, the driving mechanism 68 may be driven via a belt or the like.

A first heat insulating body 70 having a vacuum insulation structure (double-walled vacuum pipe structure) is provided.

Specifically, the first heat insulating body 70 is formed in a cylindrical shape of a double-walled pipe structure and the inside of the double-walled pipe structure is in a vacuum state. The first heat insulating body 70 surrounds the cold head 52a of the chiller 52 and a lower part of the cold heat transfer body 54 including a connection portion between the cold head 52a and the cold heat transfer body 54. With the first heat insulating body 70, it is possible to suppress the deterioration of the cooling performance due to the heat input from the external component such as the driving mechanism 68 or the like to the cold head 52a of the chiller 52 and the lower part of the cold heat transfer body 52 which are the most significant parts in cooling the stage 56 and the wafer W.

The second heat insulating body 71 is formed in a cylindrical shape of a double-walled vacuum pipe structure inside of which is maintained in a vacuum state. Further, the second heat insulating body 71 surrounds substantially the entire cold heat transfer body 5 and is disposed at inner side of the first heat insulating body 70 such that the second heat insulating body 71 is partially overlapped with the first heat insulating body 70. With the second heat insulating body 71, it is possible to suppress the deterioration of the cooling performance due to the heat input from, e.g., the magnetic fluid seal or the first cooling gas leaked into a space S provided outside thereof to the cold heat transfer body 54. Since the first heat insulating body 70 and the second heat insulating body 71 are overlapped at the lower part of the cold heat transfer body 54, it is possible to insulate the cold heat transfer body 54 entirely and improve the heat insulation at the cold head 52a and its vicinity.

Further, with the first heat insulating body 70 and the second heat insulating body 71, it is also possible to suppress the cold heat of the chiller 52 and the cold heat transfer body 54 from being transferred to the outside.

A sealing member 81 is disposed between the second heat insulating body 71 and the lower end of the diameter-reduced section 58c of the main body 58a of the stage support 58. The space S sealed with the sealing member 81 is defined by the main body 58a of the stage support 58, the second heat transfer part 54b of the cold heat transfer body 54, and the upper portion of the second heat insulating body 71. The first cooling gas leaked from the gap G flows into the space S. A gas channel 72 is connected to the space S through the sealing member 81. The gas channel 72 extends downward from the space S. A gap between the upper surface of the second heat insulating body 71 and the second heat transfer part 54b of the cold heat transfer body 54 is sealed with a sealing member 82. The sealing member 82 suppresses the supply of the first cooling gas leaked into the space S to the main body of the cold heat transfer body 54.

The gas channel 72 may discharge the gas in the space S and/or supply the cooling gas to the space S. In any of cases of discharging the gas in the space S and supplying the cooling gas to the space S using the gas channel 72, it is possible to prevent the deterioration of the sealing performance due to the decrease in the temperature of the magnetic fluid by the first cooling gas flowing into the seal rotation mechanism 62. In other words, when the gas channel 72 has a gas discharge function, the first cooling gas leaked into the space S can be discharged before it reaches the seal rotation mechanism 62. When the gas channel 72 has a cooling gas supply function, the third cooling gas is supplied as counterflow to the first cooling gas leaked from the gap G. In order to enhance the function of the third cooling gas as the counterflow, the supply pressure of the third cooling gas is preferably substantially equal to or slightly higher than that of the first cooling gas.

When the gas channel 72 has the gas discharge function, the discharge of the first cooling gas from the gap G is promoted, which makes it possible to supply the fresh first cooling gas from the first cooling gas supply line 54a to the gap G.

When the gas channel 72 has the gas supply function, a gas such as argon (Ar) gas or neon (Ne) gas having low thermal conductivity compared to that of the first cooling gas is supplied as the third cooling gas to prevent condensation.

The stage device 50 may include a temperature sensor for detecting the temperature of the cold heat transfer body 54, the gap G, and the like. As an example of the temperature sensor, it is possible to use, e.g., a low-temperature sensor such as a silicon diode temperature sensor, a platinum resistance temperature sensor, or the like.

<Heat Insulating Structure of the Stage Support>

Next, the heat insulating structure of the stage support 58 of the stage device 50 will be described.

As described above, the stage support 58 rotatably supports the stage 56 and is in direct contact with the stage 56 that is cooled by the cold heat transfer body 54. Further, the stage support 58 is disposed at a position close to the seal rotation mechanism 62 having magnetic fluid seal. The decrease in the temperature of the magnetic fluid decreases causes the deterioration of the sealing performance or the occurrence of condensation. Therefore, it is necessary to maintain the temperature of the magnetic fluid at a certain level. When the stage 56 is rotated, shear heating is generated at the magnetic fluid. Accordingly, the seal rotation mechanism 62 has a high temperature of about 100° C. (373K). This heat is transferred to the stage support 58 and inputted to the stage 56, thereby deteriorating the cooling performance for cooling the stage 56. Further, the stage support 58 receives radiant heat from the outside. This radiant heat also affects the cooling performance.

Therefore, the stage support 58 has a heat insulating structure to minimize the heat transferred to the stage 56 through the stage support 58. Generally, a member made of a material having low thermal conductivity is selected to increase a heat insulating property thereof. However, in an extremely low-temperature environment of the present embodiment, the material having low thermal conductivity quickly reaches a temperature of the extremely low-temperature environment and, thus, a desired heat insulating effect cannot be obtained. Accordingly, in the present embodiment, at least a part of the stage support 60 has a vacuum insulation structure.

In addition, as described above, the stage support 58 has the diameter-reduced section 58c at the axially central portion of the main body 58a. This structure also contributes to the heat insulation. In other words, the inner side of the stage support 58 is the space S into which the first cooling gas leaks from the gap G, and as the space S increases, the amount of heat exchange with the leaked first cooling gas increases. The cooling gas leaked from the gap G may have a high temperature, and this may lead to the increase of the temperature of the stage support 58 due to the heat exchange. By providing the diameter-reduced section 58c, the volume of the space S can be reduced, and the increase in the temperature of the stage support 58 due to the heat exchange can be suppressed.

Hereinafter, several examples of the vacuum insulation structure of the stage support 58 will be described.

First Example of the Heat Insulating Structure of the Stage Support

Figure 5:
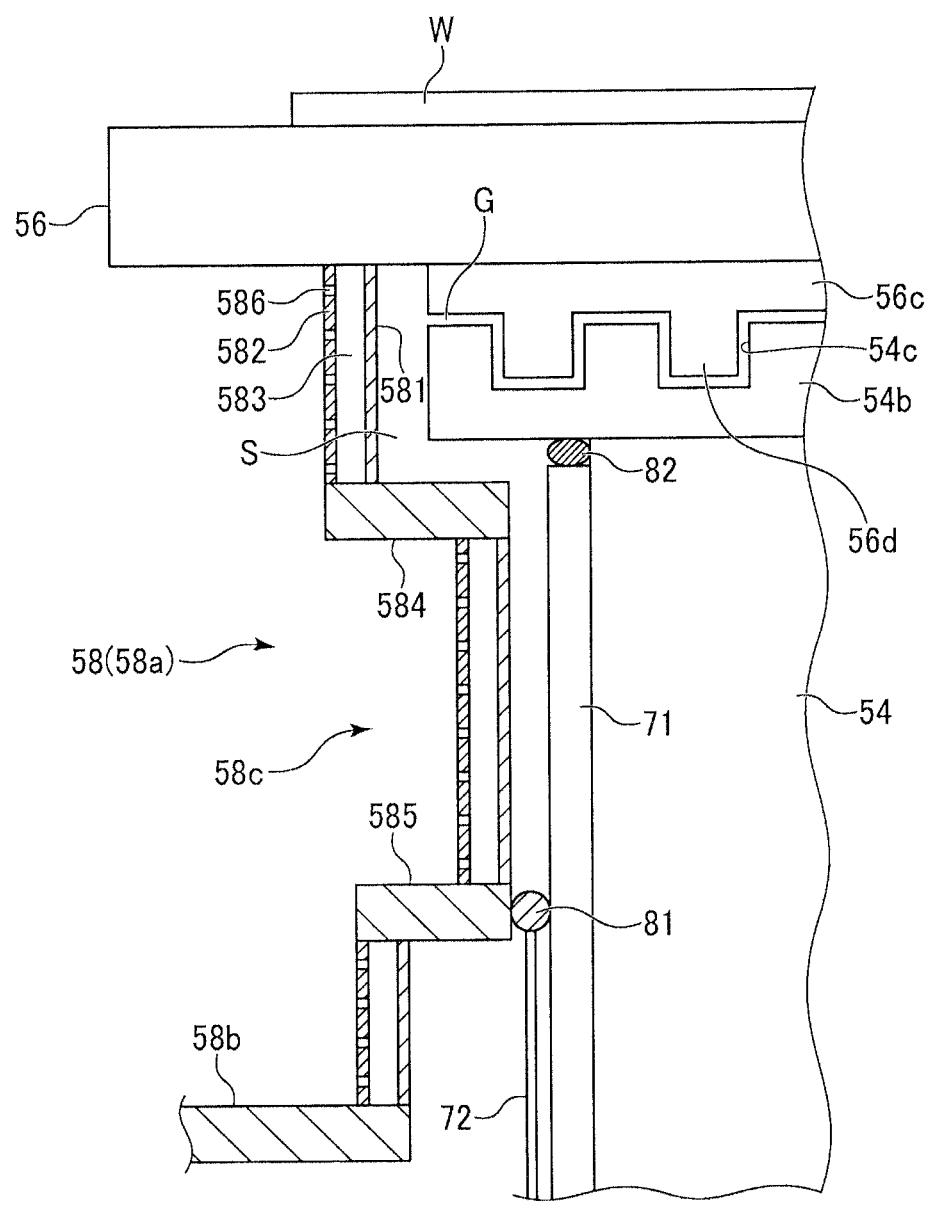
FIG. 5 is a cross-sectional view showing a first example of a heat insulating structure of a stage support.

FIG. 5 is a cross-sectional view showing a first example of the heat insulating structure of the stage support 58.

In this example, the main body 58a of the stage support 58 has an inner pipe 581 and an outer pipe 582 that form a double-walled pipe structure. Further, an inner space 583 between the inner pipe 581 and the outer pipe 582 is maintained in a vacuum state, thereby forming a double-walled vacuum pipe structure having a vacuum insulation structure. Accordingly, high heat insulation can be obtained. In addition, horizontal parts 584 and 585, which are parts of the diameter-reduced section 58c of the main body 58a of the stage support 58, are formed as solid plates having no empty space therein to ensure strength.

Since the inner pipe 581 and the outer pipe 582 are provided to form the double-walled pipe structure, the strength can be maintained even if the inner pipe 581 and the outer pipe 582 are thin. As the inner pipe 581 and the outer pipe 582 become thinner, the thermal resistance can be increased, which results in the improvement of the heat insulating effect. Each of the inner pipe 581 and the outer pipe 582 has a thickness of, e.g., 0.3 mm.

A method for forming the double-walled vacuum pipe structure is not particularly limited. For example, the inner space 583 between the inner pipe 581 and the outer pipe 582 may be evacuated and sealed to constantly serve as a vacuum layer.

In the example shown in FIG. 5, the stage support 58 is disposed at an inner side of the bellows 64 which is a vacuum space communicating with the vacuum chamber 10. Therefore, this vacuum state can be used. In other words, the outer pipe 582 has a plurality of through-holes 586. Accordingly, the inner space 583 can be set to a high vacuum state through the through-holes 586, and the vacuum insulation structure of the double-walled pipe can be obtained.

In the case of manufacturing a sealed structure after the above-described space is evacuated, a long period of time is required for the manufacture and a vacuum level may decrease during that period. However, by using the vacuum state of the vacuum chamber 10, the inner space 583 can easily become the vacuum state and the deterioration of the vacuum level can be prevented.

Figure 6:
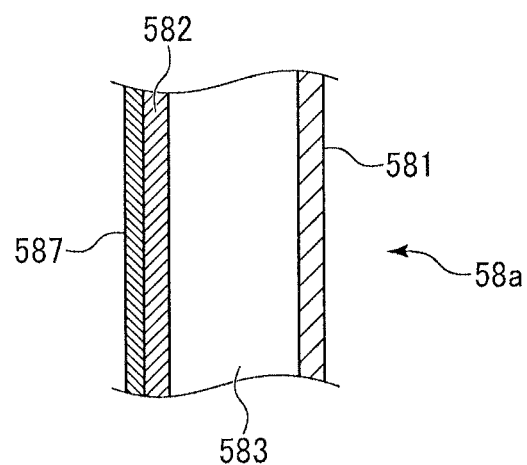
FIG. 6 is a partial cross-sectional view showing a modification in which a radiant heat shield is disposed on a surface of an outer pipe of the stage support shown in FIG. 5.

In addition, as shown in FIG. 6, a radiant heat shield 587 may be disposed at an outer side of the outer pipe 582. The stage support 58 receives radiant heat from the outside in addition to the heat transferred from the magnetic fluid seal 62. The radiant heat also affects the cooling performance. By providing the radiant heat shield 587, it is possible to block the radiant heat transferred from the outside to the stage support 58, so that the cooling performance can be further improved. Aluminum may be preferably used as the radiant heat shield 587. Alternatively, a base made of resin or the like on which aluminum is deposited or to which an aluminum foil is attached may be used as the radiant heat shield 587. The radiant heat shield 587 may be formed by directly depositing, e.g., aluminum on the outer pipe 582 or directly attaching, e.g., an aluminum foil to the outer pipe 582.

Second Example of the Heat Insulating Structure of the Stage Support

Figure 7:
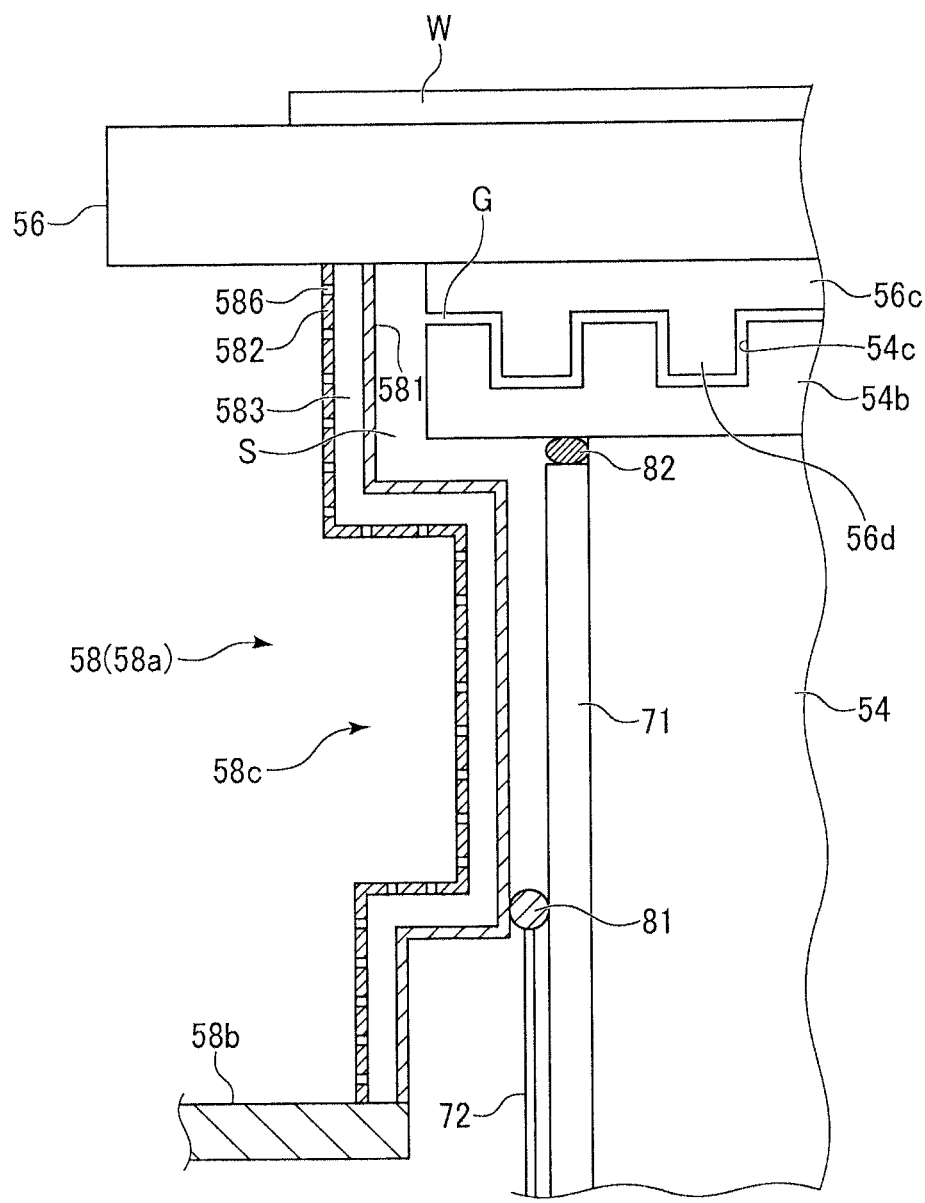
FIG. 7 is a cross-sectional view showing a second example of the heat insulating structure of the stage support.

FIG. 7 is a cross-sectional view of a second example of the heat insulating structure of the stage support 58.

In this example, as described in the first example, the main body 58a of the stage support 58 has an inner pipe 581 and an outer pipe 582 that form a double-walled pipe structure. Further, the inner space 583 between the inner pipe 581 and the outer pipe 582 is maintained in a vacuum state, thereby forming a double-walled vacuum pipe structure having a vacuum insulation structure. However, in the second example, the horizontal parts 584 and 586 formed as the solid plates having no empty space therein are not provided, and the entire main body 58a of the stage support 58 has the double-walled vacuum pipe structure.

If there is no problem in strength, the entire main body 58a is configured to have the double-walled vacuum pipe structure. In that case, there is no heat exchange through the solid plates and, thus, the cooling performance can be further improved.

In this example, as described in the first example, the method for forming the double-walled vacuum pipe structure is not particularly limited.

In the example shown in FIG. 7, as described in the example shown FIG. 5, the outer pipe 582 having the through-holes 586 is used, and the vacuum state in the bellows 64 is used to set the inner space 583 to a high vacuum state through the through-holes 586. Accordingly, the inner space 583 can easily become the vacuum state and the deterioration of the vacuum level can be prevented. Moreover, in this example, the cooling performance can be further improved by blocking the radiant heat with the radiant heat shield 587 disposed at the outer side of the outer pipe 582 as shown in FIG. 6.

Third Example of the Heat Insulating Structure of the Stage Support

Figure 8:
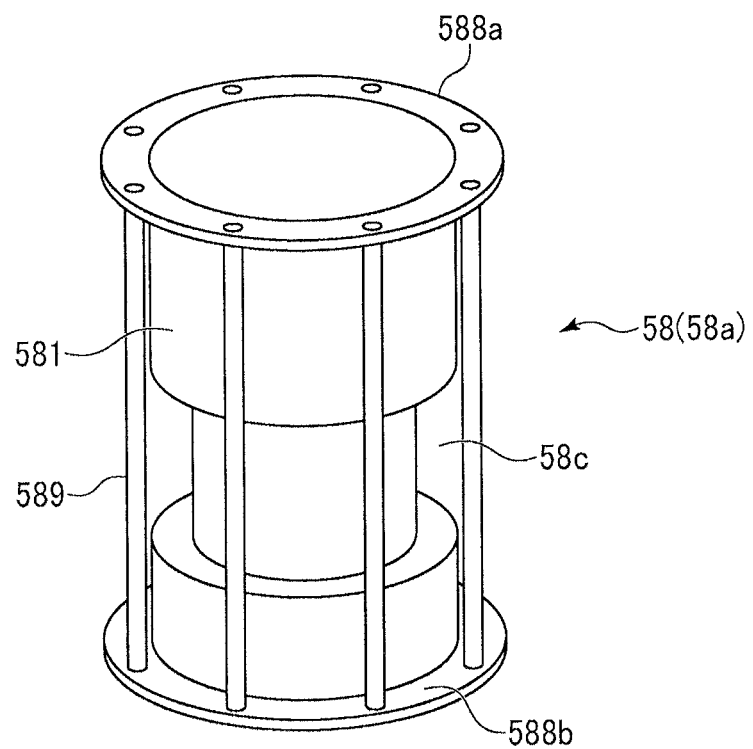
FIG. 8 is a cross-sectional view showing a third example of the heat insulating structure of the stage support.

FIG. 8 is a perspective view showing a third example of the heat insulating structure of the stage support 58.

In this example, flanges 588a and 588b are provided at an upper end and a lower end of the inner pipe 581, respectively, and a plurality of shafts 589 is arranged at equal intervals at the outer side of the inner pipe 581 to connect the flanges 588a and 588b. At this time, since the stage support 58 is in a vacuum state, the space between the inner pipe 581 and the shaft 589 becomes the vacuum state, which makes it possible to realize the vacuum insulation. Further, by providing the shafts 589 at the outer side, it is possible to reduce the heat conduction path and increase the thermal resistance while ensuring the strength (rigidity). Accordingly, the cooling performance can be further improved.

Figure 9:
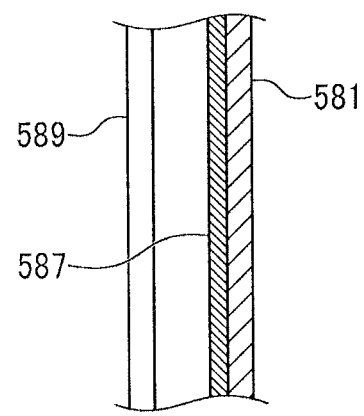
FIG. 9 is a partial cross-sectional view showing a modification in which a radiant heat shield is disposed on a surface of an inner pipe of the stage support shown in FIG. 8.

As shown in FIG. 9, the radiant heat shield 587 may be further disposed at an outer side of the inner pipe 581. Accordingly, the radiant heat from the outside can be blocked, and the cooling performance can be improved.

Fourth Example of the Heat Insulating Structure of the Stage Support

Figure 10:
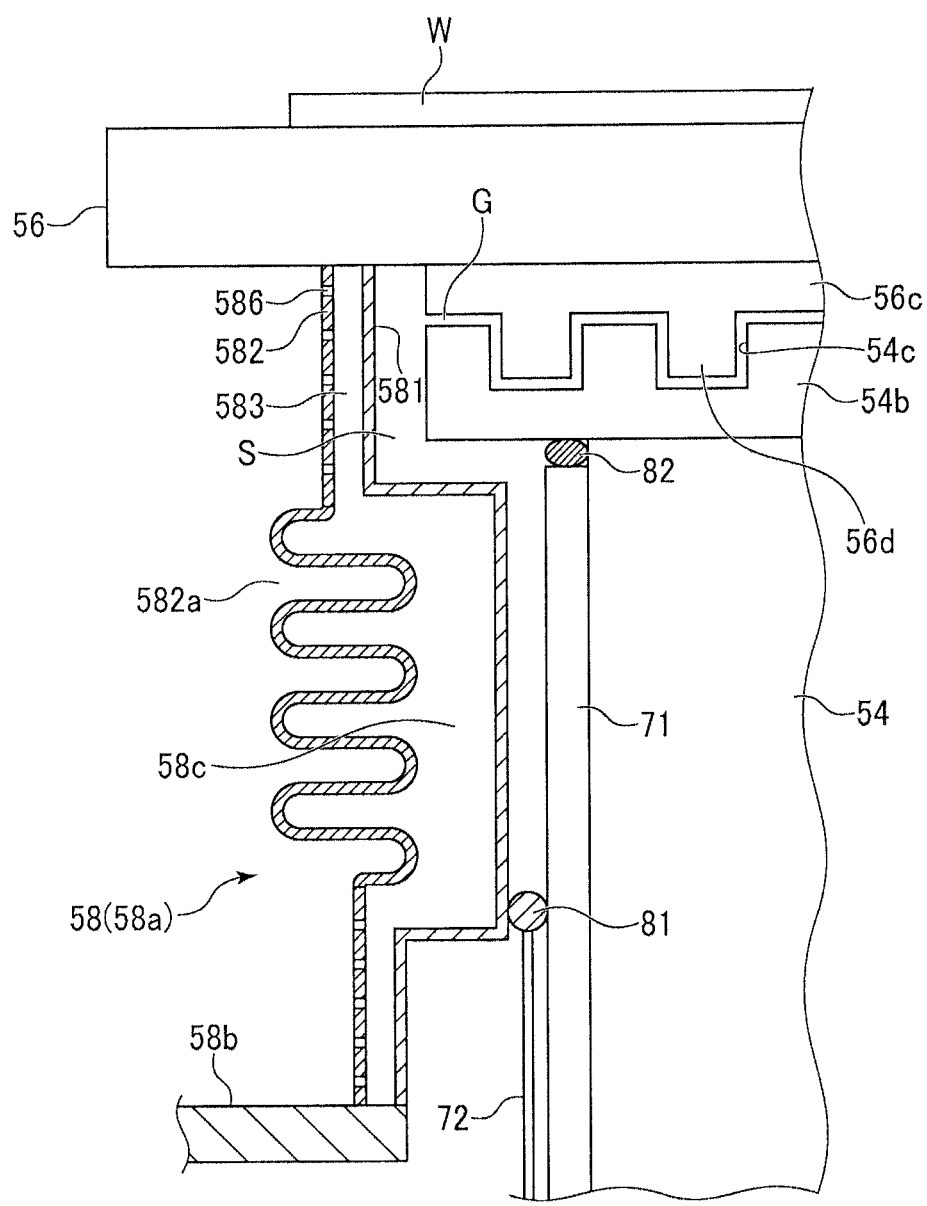
FIG. 10 is a cross-sectional view showing a fourth example of the heat insulating structure of the stage support.

FIG. 10 is a cross-sectional view showing a fourth example of the heat insulating structure of the stage support 58.

In this example, as described in the second example shown in FIG. 7, the main body 58a of the stage support 58 has a double-walled vacuum pipe structure having the inner pipe 581 and the outer pipe 582. However, this example is different from the second example in that a bent portion 582a such as a bellows or a multiple pleats is formed at the outer pipe 582. In this example, the bent portion 582a is formed at the diameter-reduced section 58c of the main body 58a. However, the formation position of the bent portion 582a is not limited thereto.

By forming the bent portion 582a such as a bellows or the like at the outer pipe 582, the thermal resistance can be increased and, thus, the heat insulating effect can be further improved. The thermal resistance can be controlled to a desired value by controlling the dimension and the number of bendings of the bent portion 582a.

The same effects can be obtained by forming a bent portion at the inner pipe 581. When a bellows is disposed at the inner pipe 581 as the bent portion, it is possible to reduce the thermal stress caused by temperature changes from a room temperature to an extremely low temperature.

<Operation of the Processing Apparatus and Effect of the Stage Device>

In the processing apparatus 1, the vacuum chamber 10 is evacuated to be in a vacuum state and the chiller 52 of the stage device 50 is operated. The first cooling gas is supplied to the gap G through the first cooling gas supply line 54a.

Then, the stage device 50 is moved (lowered) by the elevation mechanism 74 to allow the stage 56 to reach the transfer position. The wafer W is transferred from a vacuum transfer chamber (not shown) into the vacuum chamber 10 and mounted on the stage 56 by a transfer device (not shown). Next, a DC voltage is applied to the chuck electrode 56b, and the wafer W is electrostatically attracted and held by the electrostatic chuck 5.

Thereafter, the stage device 50 is moved (lifted) by the elevation mechanism 74 to allow the stage 56 to reach the processing position. At the same time, a pressure in the vacuum chamber 10 is adjusted to ultra-high vacuum (e.g., $10^{-5}$ Pa or less) that is a processing pressure. Then, the driving mechanism 68 is driven, and the rotation of the rotor 68a is transferred to the stage 56 through the rotating body 66a, the rotating part 62a, and the stage support 58. Accordingly, the stage 56 and the wafer W mounted thereon are rotated with respect to the cold heat transfer body 54.

At this time, in the stage device 50, the stage 56 is separated from the fixed cold heat transfer body 54, and thus can be rotated by the driving mechanism 68 via the stage support 58. Further, the cold heat transferred from the chiller 52 maintained at an extremely low temperature to the cold heat transfer body 54 is transferred to the stage 56 by the first cooling gas supplied to the narrow gap G of 2 mm or less. Then, the wafer W is attracted to and held on the electrostatic chuck 56a while the second cooling gas is supplied to the backside of the wafer W, so that the wafer W can be efficiently cooled by the cold heat of the stage 56. Accordingly, it is possible to rotate the wafer W together with the stage 56 while maintaining the temperature of the wafer W at an extremely low level, e.g., −30° C. or lower.

At this time, the gap G is bent to have a concave-convex pattern due to the comb-teeth shaped portion formed between the first heat transfer part 56c of the stage 56 and the second heat transfer part 54b of the cold heat transfer body 54. Therefore, the heat is efficiently transferred from the cold heat transfer body 54 to the stage 56.

While rotating the wafer W, a voltage is applied from a plasma generation power supply (not shown) to the targets 30 while introducing the sputtering gas into the vacuum chamber 10. Accordingly, plasma of the sputtering gas is generated, and the targets 30 are sputtered by ions in the plasma. Atoms or molecules of the sputtered targets are deposited on the surface of the wafer W maintained at an extremely low temperature on the stage device 50, thereby forming a desired film, e.g., a magnetic film for a TMR element having a high magneto-resistance ratio.

In the conventional case where the cooling apparatus and the film forming apparatus are provided separately as described in Japanese Patent Application Publication No. 2015-226010, it is difficult to maintain high cooling performance and the number of apparatuses increases. In the conventional technique disclosed in Japanese Patent Application Publication No. 2006-73608, the substrate can be cooled to an extremely low temperature using the cooling head cooled by the chiller in the film forming chamber. Since, however, the stage is fixed, it is difficult to perform uniform film formation.

On the other hand, in the present embodiment, the stage 26 and the cold heat transfer body 54 for transferring the cold heat of the chiller 52 maintained at an extremely low temperature are separately disposed with the gap G therebetween. Further, the cooling gas is supplied to the gap G, and the stage can be rotated via the stage support 58. Accordingly, it is possible to achieve both of the high cooling performance for the wafer W and the uniform film formation.

For example, when a magnetic film for a TMR element is formed, the wafer W may be transferred at a high temperature of 100° C. to 400° C. to the stage 56. Since it is required to cool such a high-temperature wafer W to an extremely low temperature of −223° C. to −23° C. (50K to 250K), e.g., −173° C. (100K). In this case, the heat input from the wafer W is large and, thus, in order to effectively cool the wafer W to an extremely low temperature, it is necessary to minimize the heat input from the outside other than the wafer W and improve the cooling performance.

Hence, in the present embodiment, the stage support 58 that is in direct contact with the stage 56 and receives heat from a heat generating part such as magnetic fluid seal or the like has the vacuum insulation structure. Thus, the heat input from the stage support 58 to the stage 56 can be suppressed, and the cooling performance can be maintained at an improved level. Therefore, the cooling efficiency of the cold heat transfer body 54 is improved, and the cooling time is shortened. Accordingly, the consumption amount of the first cooling gas can be reduced, which makes it possible to realize film formation at an extremely low temperature with a low cost while ensuring a high throughput.

Here, the stage support 58 has the vacuum insulation structure described in the first example to the fourth example, so that the heat input from the heat generating part to the stage 56 can be efficiently suppressed. Accordingly, the cooling performance can be improved.

Further, by using the radiant heat shield 587, the heat input of the radiant heat from the outside can be suppressed, and the cooling performance can be further improved.

Further, since the first heat insulating body 70 formed in a cylindrical shape of a double-walled vacuum pipe structure is disposed to surround the chiller 52 and the lower part of the cold heat transfer body 54, it is possible to suppress the deterioration of the cooling performance due to the heat input from the outside to the cold head 52a and the lower part of the cold heat transfer body 54 which are significant parts in the cooling performance.

Moreover, since the second heat insulating body 71 formed in a cylindrical shape of a double-walled vacuum pipe structure is disposed to surround the entire cold heat transfer body 54, it is possible to suppress the deterioration of the cooling performance due to the heat input from the outside to the cold heat transfer body 54.

<Other Applications>

The above-described embodiments are considered to be illustrative in all aspects and not restrictive. The above-described embodiments may be omitted, replaced, or changed variously without departing from the scope and the gist of the following claims.

For example, the heat insulating structure of the stage support is not limited to those described in the first example to the fourth example. Although the above-described embodiments have described the case where the present disclosure is applied to the sputtering film formation of the magnetic film used for the TMR element as an example, the present disclosure is not limited thereto as long as a uniform process is required at an extremely low temperature.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A stage device comprising:
a stage configured to hold a target substrate in a vacuum chamber;
a cold heat transfer body fixedly disposed below a bottom surface of the stage and separated from the stage with a gap between the stage and the cold heat transfer body and cooled to an extremely low temperature by a chiller disposed below the cold heat transfer body;
cooling fluid supplied to the gap to transfer cold heat of the cold heat transfer body to the stage;
a stage support configured to rotatably support the stage and including a main body formed in a cylindrical shape, the main body including an inner pipe and an outer pipe that form a double-walled vacuum pipe structure having a vacuum insulation structure to surround the gap and an upper part of the cold heat transfer body; and
a rotation part configured to support the stage support and rotated by a driving mechanism while being sealed with magnetic fluid.

2. The stage device of claim 1, wherein the stage support is disposed in a vacuum space communicating with the vacuum chamber,
the outer pipe has a plurality of through-holes, and
the inner space communicates with the vacuum space through the through-holes and becomes the vacuum space.

3. The stage device of claim 1, wherein the main body of the stage support has a diameter-reduced section, and a horizontal part of the diameter-reduced section is formed as a solid plate.

4. The stage device of claim 1, wherein the main body of the stage support has a diameter-reduced section, and the entire main body has the double-walled pipe structure.

5. The stage device of claim 1, wherein the outer pipe has a bent portion having one or more bendings.

6. The stage device of claim 1, wherein the main body of the stage support further includes a radiant heat shield disposed at an outer side of the outer pipe.

7. A stage device comprising:
a stage configured to hold a target substrate in a vacuum chamber;
a cold heat transfer body fixedly disposed below a bottom surface of the stage with a gap between the stage and the cold heat transfer body and cooled to an extremely low temperature by a chiller disposed below the cold heat transfer body;
cooling fluid supplied to the gap to transfer cold heat of the cold heat transfer body to the stage;
a stage support configured to rotatably support the stage and formed in a cylindrical shape to surround an upper part of the cold heat transfer body wherein the stage support has a vacuum insulation structure; and
a rotation part configured to support the stage support and rotated by a driving mechanism while being sealed with magnetic fluid,
wherein the stage support is disposed in a vacuum space communicating with the vacuum chamber, and
a main body of the stage support includes an inner pipe, flanges respectively disposed at an upper end and a lower end of the inner pipe, and a plurality of shafts disposed at an outer side of the inner pipe to connect the flanges.

8. The stage device of claim 7, wherein the stage support further includes a radiant heat shield disposed at the outer side of the inner pipe.

9. The stage device of claim 1, wherein the stage includes an electrostatic chuck configured to electrostatically attract and hold the target substrate.

10. The stage device of claim 9, wherein the cooling fluid supplied to the gap is a first cooling gas, and the first cooling gas is supplied to the gap through a first cooling gas channel formed in the cold heat transfer body.

11. The stage device of claim 10, wherein a second cooling gas for heat transfer is supplied to a gap between the target substrate and the electrostatic chuck through a second cooling gas channel different from the first cooling gas channel.

12. The stage device of claim 10, wherein the first cooling gas is supplied to a gap between the target substrate and the electrostatic chuck through a gas channel communicating with the first cooling gas channel.

13. A stage device comprising:
a stage configured to hold a target substrate in a vacuum chamber;
a cold heat transfer body fixedly disposed below a bottom surface of the stage with a gap between the stage and the cold heat transfer body and cooled to an extremely low temperature by a chiller disposed below the cold heat transfer body;
cooling fluid supplied to the gap to transfer cold heat of the cold heat transfer body to the stage;
a stage support configured to rotatably support the stage and formed in a cylindrical shape to surround an upper part of the cold heat transfer body wherein the stage support has a vacuum insulation structure;
a rotation part configured to support the stage support and rotated by a driving mechanism while being sealed with magnetic fluid; and
a first heat insulating body formed in a cylindrical shape to surround at least a cold head of the chiller and a connection portion between the cold head and the cold heat transfer body and having a vacuum insulation structure,
wherein the stage includes an electrostatic chuck configured to electrostatically attract and hold the target substrate,
wherein the cooling fluid supplied to the gap is a first cooling gas, and the first cooling gas is supplied to the gap through a first cooling gas channel formed in the cold heat transfer body.

14. The stage device of claim 13, further comprising:
a second heat insulating body formed in a cylindrical shape to surround the cold heat transfer body and having a vacuum insulation structure.

15. The stage device of claim 14, wherein a space is formed between the stage support and the second heat insulating body and the first cooling gas leaked from the gap flows into the space, the space being sealed with a sealing member, and
- a gas channel is connected to the space to discharge the first cooling gas in the space or supply a second cooling gas as counterflow to the first cooling gas into the space.

16. The stage device of claim 1, wherein a connection portion between the stage and the cold heat transfer body has a comb-teeth shaped portion such that the gap between the stage and the cold heat transfer body has a concave-convex pattern.

17. A processing apparatus comprising:
a vacuum chamber;
a stage device and configured to rotatably support a target substrate in the vacuum chamber, the stage device comprising:
- a stage configured to hold a target substrate in the vacuum chamber,
- a cold heat transfer body fixedly disposed below a bottom surface of the stage and separated from the stage with a gap between the stage and the cold heat transfer body and cooled to an extremely low temperature by a chiller disposed below the cold heat transfer body,
- cooling fluid supplied to the gap to transfer cold heat of the cold heat transfer body to the stage,
- a stage support configured to rotatably support the stage and including a main body formed in a cylindrical shape, the main body including an inner pipe and an outer pipe that form a double-walled vacuum pipe structure having a vacuum insulation structure to surround the gap and an upper part of the cold heat transfer body, and
- a rotation part configured to support the stage support and rotated by a driving mechanism while being sealed with magnetic fluid; and
a processing mechanism configured to process the target substrate in the vacuum chamber.

18. The processing apparatus of claim 17, wherein the processing mechanism includes a target for sputtering film formation, the target being disposed above the stage in the vacuum chamber.

19. The processing apparatus of claim 18, wherein the target is made of a material forming a magnetic film used for a tunneling magneto-resistance element.

* * * * *